US009783060B2

(12) United States Patent
Chang et al.

(10) Patent No.: US 9,783,060 B2
(45) Date of Patent: Oct. 10, 2017

(54) TRACTION BATTERY LEAKAGE DETECTION SYSTEM FOR ELECTRIFIED VEHICLE

(71) Applicant: FORD GLOBAL TECHNOLOGIES, LLC, Dearborn, MI (US)

(72) Inventors: Xiaoguang Chang, Northville, MI (US); Xu Wang, Dearborn, MI (US); Chuan He, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 348 days.

(21) Appl. No.: 14/278,590

(22) Filed: May 15, 2014

(65) Prior Publication Data

US 2015/0333378 A1 Nov. 19, 2015

(51) Int. Cl.
*H01M 10/42* (2006.01)
*H01M 10/48* (2006.01)
*B60L 3/00* (2006.01)
*G01R 27/02* (2006.01)
*G01R 31/00* (2006.01)
(Continued)

(52) U.S. Cl.
CPC ............. *B60L 3/0046* (2013.01); *B60L 1/003* (2013.01); *B60L 1/02* (2013.01); *B60L 3/0069* (2013.01); *B60L 11/123* (2013.01); *B60L 11/14* (2013.01); *B60L 11/1816* (2013.01); *B60L 11/1864* (2013.01); *B60L 11/1868* (2013.01); *B60L 11/1877* (2013.01); *G01R 27/025* (2013.01); *G01R 31/006* (2013.01); *G01R 31/025* (2013.01); *H01M 10/4228* (2013.01); *H01M 10/4285* (2013.01); *H01M 10/48* (2013.01); *B60L 2210/10* (2013.01); *B60L 2210/40* (2013.01); *B60L 2240/24* (2013.01); *B60L 2240/34* (2013.01); *B60L 2240/547* (2013.01); *B60L 2240/549* (2013.01); *G01R 31/36* (2013.01); *H01M 2220/20* (2013.01); *Y02T 10/6217* (2013.01); *Y02T 10/7005* (2013.01); *Y02T 10/7061* (2013.01); *Y02T 10/7066* (2013.01); *Y02T 10/7072* (2013.01); *Y02T 10/7077* (2013.01); *Y02T 10/7216* (2013.01);
(Continued)

(58) Field of Classification Search
CPC combination set(s) only.
See application file for complete search history.

(56) References Cited

U.S. PATENT DOCUMENTS 5,382,946 A  1/1995  Gale
5,760,587 A  6/1998  Harvey
(Continued)

FOREIGN PATENT DOCUMENTS

WO    2010029353 A1    3/2010

*Primary Examiner* — Ula C Ruddock
*Assistant Examiner* — Osei Amponsah
(74) *Attorney, Agent, or Firm* — David Kelley; Brooks Kushman P.C.

(57) ABSTRACT

A leakage detection system for a battery pack of a vehicle may include detection circuitry having a first side connecting a positive terminal of the pack to ground and a second side connecting a negative terminal of the pack to ground, and including no more than one switch among the sides. The system may also include measurement circuitry configured to measure a voltage across a resistor of one of the sides when the switch is open and closed, and a controller programmed to output a leakage associated with the battery pack based on the voltage.

10 Claims, 4 Drawing Sheets

(51) Int. Cl.

| | | |
|---|---|---|
| *G01R 31/02* | (2006.01) | |
| *B60L 1/00* | (2006.01) | |
| *B60L 1/02* | (2006.01) | |
| *B60L 11/12* | (2006.01) | |
| *B60L 11/14* | (2006.01) | |
| *B60L 11/18* | (2006.01) | |
| *G01R 31/36* | (2006.01) | |

(52) U.S. Cl.
CPC .......... *Y02T 10/7241* (2013.01); *Y02T 90/127* (2013.01); *Y02T 90/14* (2013.01)

(56) References Cited

U.S. PATENT DOCUMENTS

| | | |
|---|---|---|
| 6,998,819 B2 | 2/2006 | Jin |
| 7,102,356 B2 | 9/2006 | Wild |
| 7,459,914 B2 | 12/2008 | Lindsey |
| 7,952,327 B2 | 5/2011 | Kudo et al. |
| 8,319,650 B2 | 11/2012 | Volodymyr et al. |
| 8,427,167 B2 | 4/2013 | Streit |
| 2004/0227521 A1* | 11/2004 | Higashihama ......... G01R 31/40 324/522 |
| 2008/0054907 A1* | 3/2008 | Kudo ................... G01R 31/025 324/426 |
| 2008/0129308 A1* | 6/2008 | Lindsey ................ B60L 3/0023 324/525 |
| 2011/0181247 A1* | 7/2011 | Park .................. H01M 10/4264 320/118 |
| 2012/0221269 A1 | 8/2012 | Wanner et al. |

* cited by examiner

TRACTION BATTERY LEAKAGE DETECTION SYSTEM FOR ELECTRIFIED VEHICLE

TECHNICAL FIELD

Disclosed herein is a traction battery electrical leakage detection system for an electrified vehicle.

BACKGROUND

Effective systems for detecting electrical isolation issues in high voltage systems of motor vehicles may be important. Electrical isolation issues may be realized upon the detection of current leakage at a vehicle battery. Leakage detection circuits may be designed to detect such issues.

SUMMARY

A leakage detection system for a battery pack of a vehicle may include detection circuitry having a first side connecting a positive terminal of the pack to ground and a second side connecting a negative terminal of the pack to ground, and including no more than one switch among the sides. The system may also include measurement circuitry configured to measure a voltage at a resistor of one of the sides when the switch is open and closed, and a controller programmed to output a leakage associated with the battery pack based on the voltage.

A method for detecting leakage of a vehicle battery may include receiving a first voltage measurement indicative of a voltage at a resistor at one of a positive and negative side of a leakage detection circuit associated with the battery when a switch at the other of the positive and negative side of the circuit is open, receiving a second voltage measurement indicative of the voltage at the resistor when the switch is closed, and outputting an overall leakage resistance associated with the battery based on the first and second voltage measurements.

A leakage detection system may include leakage circuitry defining current paths between a positive terminal of a battery and ground and between a negative terminal of the battery and ground, and including no more than one switch and at least one resistor arranged among the current paths such that voltages across the resistor associated with an open and closed state of the switch are indicative of a leakage of the battery.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Electrical isolation may be important to BEV (battery electric vehicles), PHEV (plug-in hybrid electrical vehicles) and HEV (hybrid electrical vehicles), and other vehicles. By measuring leakage detection, isolation issues may be detected between the battery pack and the chassis. Thus, highly efficient and accurate leakage detection systems are desired.

Described herein is a leakage detection system including a leakage detection circuit configured to detect leakage at both sides of a battery (i.e., the positive and negative sides), regardless of the leakage values at each side. If the leakage detection system is not well designed and a similar leakage is detected at each side of the battery, the overall leakage may not be detectable.

In the present leakage detection circuit, a simplified design accompanied by an enhanced process for detecting leakage allows for a leakage detection system capable of detecting leakage at both sides of the battery, regardless of the leakage values thereof. The circuit may include a switch and a voltage measurement circuit at an opposite battery side of the switch. The circuit eliminates the need for an additional switch and voltage measurement device while accurately predicting leakage on both sides of the battery, regardless of the conditions (e.g., conditions including similar amounts of leakage at each battery side that may skew the predicted amounts.)

Figure 1:
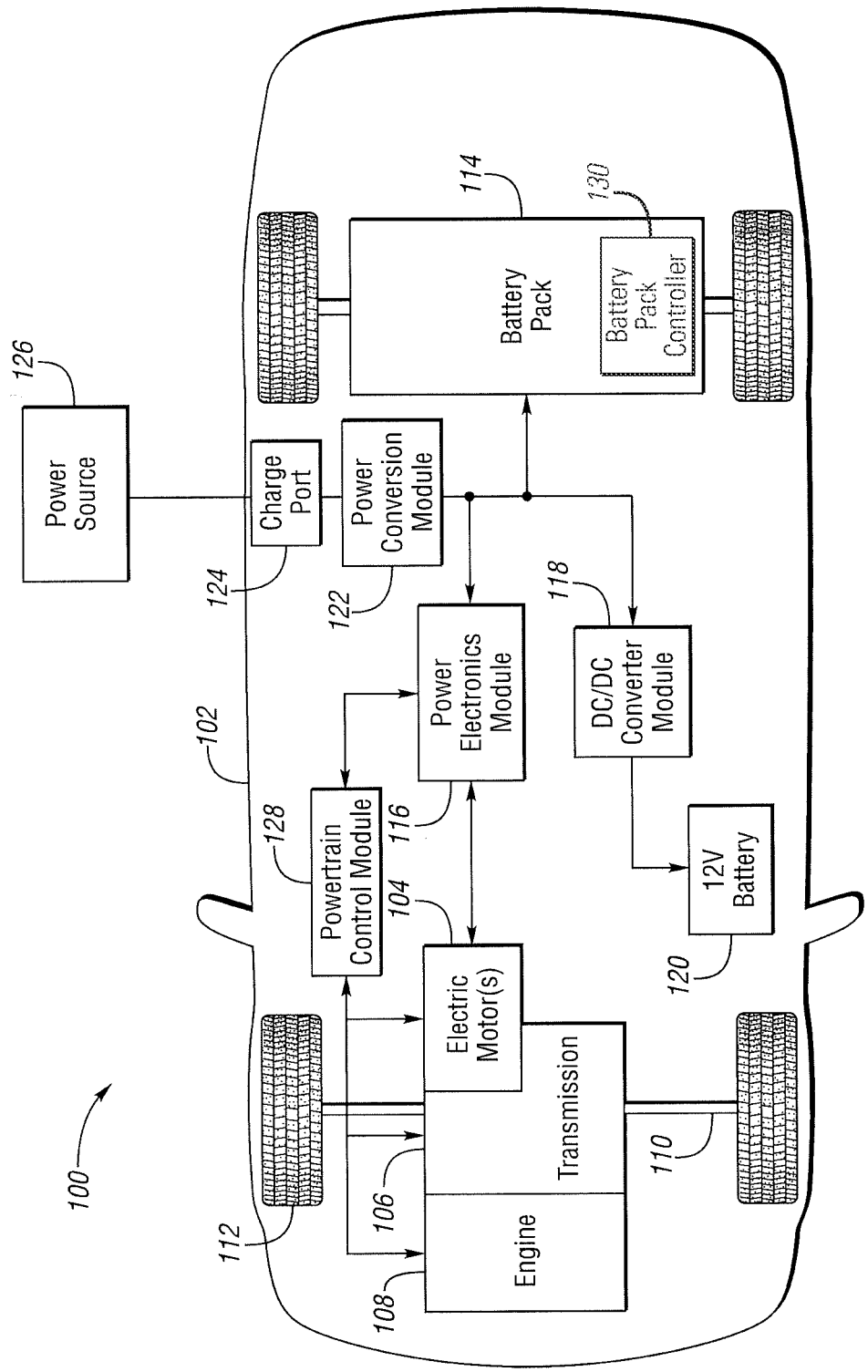
FIG. 1 illustrates an example hybrid-electric vehicle with a battery pack.

FIG. 1 depicts an example of a vehicle 100. A plug-in hybrid-electric vehicle 102 may comprise one or more electric motors 104 mechanically connected to a hybrid transmission 106. In addition, the hybrid transmission 106 is mechanically connected to an engine 108. The hybrid transmission 106 may also be mechanically connected to a drive shaft 111 that is mechanically connected to the wheels 112. The electric motors 104 can provide propulsion when the engine 108 is turned off (e.g., vehicle works in electric vehicle mode). The electric motors 104 can provide deceleration capability when the vehicle 102 slows down. The electric motors 104 may be configured as generators and can provide fuel economy benefits by recovering energy that would normally be lost as heat in the friction braking system. The electric motors 104 may also reduce pollutant emissions since the hybrid electric vehicle 102 may be operated in electric vehicle mode under certain conditions.

The battery pack 114 stores energy that can be used by the electric motors 104. A vehicle battery pack 114 typically provides a high voltage DC output. The battery pack 114 is electrically connected to a power electronics module 116. The power electronics module 116 is also electrically connected to the electric motors 104 and provides the ability to bi-directionally transfer energy between the battery pack 114 and the electric motors 104. For example, a typical battery pack 14 may provide a DC voltage while the electric motors 4 may require a three-phase AC current to function. The power electronics module 16 may convert the DC voltage to a three-phase AC current as required by the electric motors 104. In a regenerative mode, the power electronics module 116 will convert the three-phase AC current from the electric motors 104 acting as generators to the DC voltage required by the battery pack 114. The methods described herein are equally applicable to a pure electric vehicle or any other device using a battery pack.

In addition to providing energy for propulsion, the battery pack 114 may provide energy for other vehicle electrical systems. A typical system may include a DC/DC converter module 118 that converts the high voltage DC output of the battery pack 114 to a low voltage DC supply that is compatible with other vehicle loads. Other high voltage loads, such as compressors and electric heaters, may be connected directly to the high-voltage bus from the battery pack 114. In a typical vehicle, the low voltage systems are electrically connected to a 12V battery 120. An all-electric vehicle may have a similar architecture but without the engine 108.

The battery pack 114 may be recharged by an external power source 126. The external power source 126 may provide AC or DC power to the vehicle 102 by electrically connecting through a charge port 124. The charge port 124 may be any type of port configured to transfer power from the external power source 126 to the vehicle 102. The charge port 124 may be electrically connected to a power conversion module 122. The power conversion module may condition the power from the external power source 126 to provide the proper voltage and current levels to the battery pack 114. In some applications, the external power source 126 may be configured to provide the proper voltage and current levels to the battery pack 114 and the power conversion module 122 may not be necessary. The functions of the power conversion module 122 may reside in the external power source 126 in some applications. The vehicle engine, transmission, electric motors and power electronics may be controlled by a powertrain control module (PCM) 128.

The battery pack 114 may also include a battery pack controller 130. The battery pack controller 130 includes a leakage detection circuit 135, or detection circuitry 135, (as shown in FIG. 2.) The battery pack controller 130 may control and monitor the performance of the battery pack 114. It may receive voltage measurements from the leakage detection circuit 135 to determine whether an isolation issue has occurred from the high voltage system to vehicle chassis. The controller 130 may include a processor and a memory configured to facilitate the process 300 described below with respect to FIG. 3.

In addition to illustrating a plug-in hybrid vehicle, FIG. 1 may also illustrate a battery electric vehicle (BEV), a traditional hybrid electric vehicle (HEV) and a power-split hybrid electric vehicle. The various components discussed may have one or more associated controllers (including the battery pack controller 130) to control and monitor the operation of the components. The controllers may communicate via a serial bus (e.g., Controller Area Network (CAN)) or via discrete conductors.

Figure 2A:
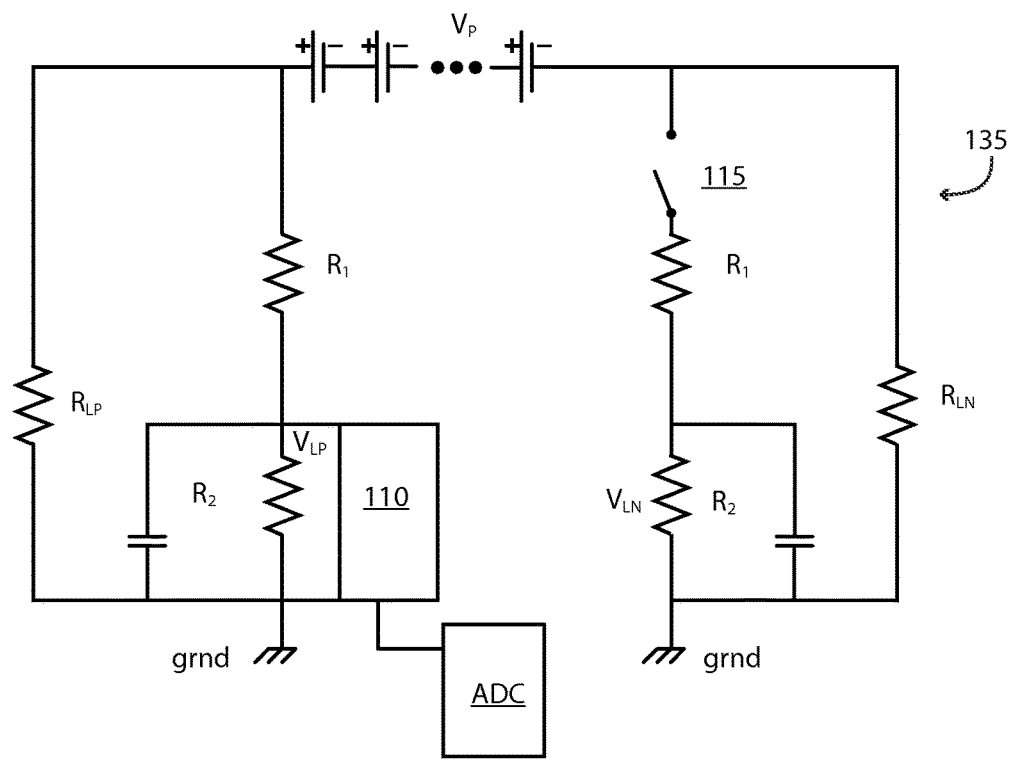
FIGS. 2A and 2B illustrate exemplary leakage detection circuits.

FIG. 2A shows an exemplary leakage detection circuit 135 having two sides, a first positive (left), and second negative (right) side (hereinafter referred to as the positive side and the negative side). The leakage detection circuit 135 may include the following:

SW Switch
$R_{LP}$ Leakage resistance at positive side
$R_{LN}$ Leakage resistance at negative side
$R_1$ Resistor
R2 Resistor
$V_{LP1}$ Leakage voltage at positive side when SW is closed
$V_{LN1}$ Leakage voltage at negative side when SW is closed
$V_{P1}$ Battery pack voltage when SW is closed
$V_{LP2}$ Leakage voltage at positive side when SW is opened
$V_{LN2}$ Leakage voltage at negative side when SW is opened
$V_{P2}$ Battery pack voltage when SW is opened In addition to the above, the circuit 135 may also include at least one ground (grnd). Because the battery pack 114 and the chassis have the same ground, the circuit 135 and the chassis may also have the same ground. The positive side of the battery may connect a positive terminal of the battery pack 114 to the ground and the negative side of the battery may connect a negative terminal of the battery pack 114 to the ground. The circuit 135 may define a current path between each of the terminals and the ground. At least a portion of the circuit 135 may form an RC circuit.

In practice, leakage is measured from both the positive and negative terminals of the battery. In FIG. 2, $R_{LP}$ and $R_{LN}$ may not be physical resistors but may be indicative of the leakage resistance at the positive and negative sides, respectively. The overall leakage is a parallel combination of the two leakage resistances. A small leakage resistance may indicate leakage while a large leakage resistance may indicate no leakage. The Federal Motor Vehicle Safety Standard (FMVSS) for a maximum leakage resistance post collision (or accident) may be 500 ohm/volt. The severe fault threshold resistance may be 100 ohms/volt, which is recommended by ISO 6469-3.

The switch SW may be a photoMOS relay switch, or any other switch. The current circuit 135 only includes one switch, which may open and closed to gather leakage voltages at $V_{LP}$. The switch SW may be controlled by the controller 130, or some other mechanism within the circuit 135. The controller 130 may instruct the switch to open and close according to certain trigger events. These trigger events may include the expiration of a predefined amount of time so that the circuit 135 may check for leakage at defined intervals. The trigger event may also include a lapse of time after the controller 130 has calculated a voltage value of the battery pack (e.g., the switch may alternate being at open and closed positions each time the leakage voltages have been determined.)

A voltage detector 110 (or measurement circuitry) may be in communication with $R_2$. The voltage detector 110 may be configured to detect the voltage across $R_2$ (i.e., $V_{LP}$). The voltage detector 110 may be coupled to an analog-to-digital converter ADC to communicate with the controller 130. Any non-bias low voltage measurement technologies can be used as voltage detector 110.

In order to determine and estimate the leakage, the switch may first be opened, and then closed, with voltage measurements $V_{LP}$ and $V_P$ taken at each instance. When the switch is closed, the following is true:

$$\frac{V_{LN1}}{R_2}(R_1 + R_2) + \frac{V_{LP1}}{R_2}(R_1 + R_2) = V_{P1} \quad \text{(Eq. 1)}$$

and $$\frac{V_{LN1}}{R_2 R_{LN}}(R_1 + R_2) + \frac{V_{LN1}}{R_2} = \frac{V_{LP1}}{R_2 R_{LP}}(R_1 + R_2) + \frac{V_{LP1}}{R_2} \quad \text{(Eq. 2)}$$

From Eq.1, $V_{LN1}$ may be derived:

$$V_{LN1} = \frac{V_{P1} R_2 - V_{LP1}(R_1 + R_2)}{(R_1 + R_2)} \quad \text{(Eq. 3)}$$

In Eq.2, substitute equation 3 for $V_{LP1}$:

$$\frac{[V_{P1} R_2 - V_{LP1}(R_1 + R_2)](R_1 + R_2)}{R_{LN}} + [V_{P1} R_2 - V_{LP1}(R_1 + R_2)] = \quad \text{(Eq. 4)}$$

$$\frac{V_{LP1}(R_1 + R_2)(R_1 + R_2)}{R_{LP}} + V_{LP1}(R_1 + R_2)$$

When SW is opened, the following is true:

$$\frac{V_{LP2}(R_1+R_2)}{R_{LN}} + \frac{V_{LP2}(R_1+R_2)}{R_{LP}} + V_{LP2} = \frac{V_{P2}R_2}{R_{LN}} \quad \text{(Eq. 5)}$$

The positive and negative leakage resistance can be calculated by solving equations in groups:

$$\begin{cases} \dfrac{V_{LP2}(R_1+R_2) - V_{P2}R_2}{R_{LN}} + \dfrac{V_{LP2}(R_1+R_2)}{R_{LP}} \\ \qquad = -V_{LP2} \\ \dfrac{[V_{P1}R_2 - V_{LP1}(R_1+R_2)](R_1+R_2)}{R_{LN}} - \dfrac{V_{LP1}(R_1+R_2)(R_1+R_2)}{R_{LP}} \\ \qquad = 2V_{LP1}(R_1+R_2) - V_{P1}R_2 \end{cases} \quad \text{(Eq. 6)}$$

Solving for $R_{LN}$:

$$R_{LN} = \frac{(R_1+R_2)(V_{LP2}V_{P1}R_2 - V_{LP1}V_{P2}R_2)}{V_{LP1}V_{LP2}(R_1+R_2) - V_{P1}V_{LP2}R_2} \quad \text{(Eq. 7)}$$

Solving for $R_{LP}$:

$$R_{LP} = \frac{(R_1+R_2)(R_1+R_2)(V_{LP1}V_{P2}R_2 - V_{LP2}V_{P1}R_2)}{V_{LP1}V_{LP2}(R_1+R_2)(R_1+R_2) - 2V_{LP1}V_{P2}(R_1+R_2)R_2 + V_{P1}V_{P2}R_2R_2} \quad \text{(Eq. 8)}$$

The overall leakage (RR) is the parallel combination of positive and negative leakage resistances:

$$RR = \frac{R_{LN}R_{LP}}{R_{LN}+R_{LP}} \quad \text{(Eq. 9)}$$

Figure 2B:
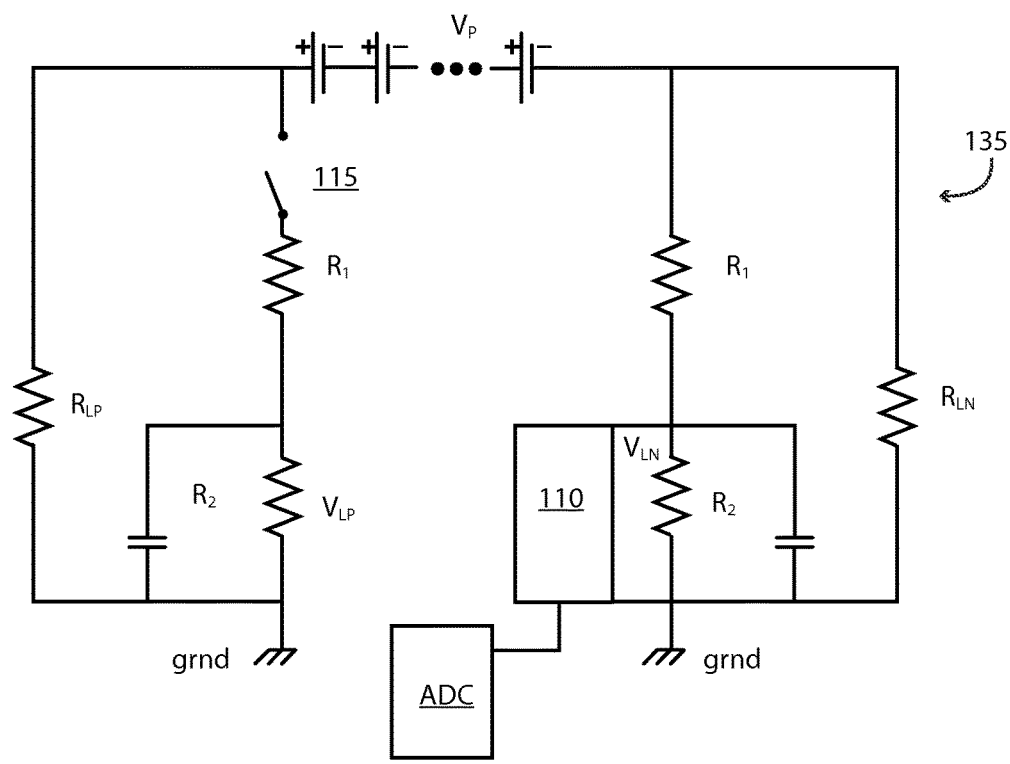

FIG. 2B shows another exemplary leakage detection circuit 135 similar to the one shown in FIG. 2A but with the voltage detector 110 and the converter ADC at the negative side of the circuit and the switch 115 at the positive side. Accordingly, the switch 115 may be arranged on the opposite side of the circuit 135 that the voltage measurement is taken.

In order to determine and estimate the leakage, the switch 115 may first be opened, and then closed, with voltage measurements $V_{LN}$ and $V_P$ taken at each instance. When the switch is closed, equation 1 is true, and $V_{LP1}$ may be derived:

$$V_{LP1} = \frac{V_{P1}R_2 - V_{LN1}(R_1+R_2)}{(R_1+R_2)} \quad \text{(Eq. 10)}$$

Substituting equation 10 into equation 2 for $V_{LP1}$:

$$\frac{[V_{P1}R_2 - V_{LN1}(R_1+R_2)](R_1+R_2)}{R_{LP}} + [V_{P1}R_2 - V_{LN1}(R_1+R_2)] = \frac{V_{LN1}(R_1+R_2)(R_1+R_2)}{R_{LN}} + V_{LN1}(R_1+R_2) \quad \text{(Eq. 11)}$$

When switch 115 is opened, the following is true:

$$\frac{V_{LN2}(R_1+R_2)}{R_{LN}} + \frac{V_{LN2}(R_1+R_2)}{R_{LP}} + V_{LN2} = \frac{V_{P2}R_2}{R_{LP}} \quad \text{(Eq. 12)}$$

The positive and negative leakage resistances may be calculated by solving equations in groups:

$$\begin{cases} \dfrac{V_{LN2}(R_1+R_2)}{R_{LN}} + \dfrac{V_{LP2}(R_1+R_2) - V_{P2}R_2}{R_{LP}} \\ \qquad = -V_{LN2} \\ \dfrac{[V_{P1}R_2 - V_{LN2}(R_1+R_2)](R_1+R_2)}{R_{LP}} - \dfrac{V_{LN1}(R_1+R_2)(R_1+R_2)}{R_{LN}} \\ \qquad = 2V_{LN2}(R_1+R_2) - V_{P1}R_2 \end{cases} \quad \text{(Eq. 13)}$$

Solving for $R_{LP}$:

$$R_{LP} = \frac{(R_1+R_2)(V_{LN2}V_{P1}R_2 - V_{LN1}V_{P2}R_2)}{V_{LN1}V_{LN2}(R_1+R_2) - V_{P1}V_{LN2}R_2} \quad \text{(Eq. 14)}$$

Solving for $R_{LN}$:

$$R_{LN} = \frac{(R_1+R_2)(R_1+R_2)(V_{LN1}V_{P2}R_2 - V_{LN2}V_{P1}R_2)}{V_{LN1}V_{LN2}(R_1+R_2)(R_1+R_2) - 2V_{LN1}V_{P2}(R_1+R_2)R_2 + V_{P1}V_{P2}R_2R_2} \quad \text{(Eq. 15)}$$

The overall leakage (RR) is the parallel combination of positive and negative leakage resistances as shown in equation 9.

Figure 3:
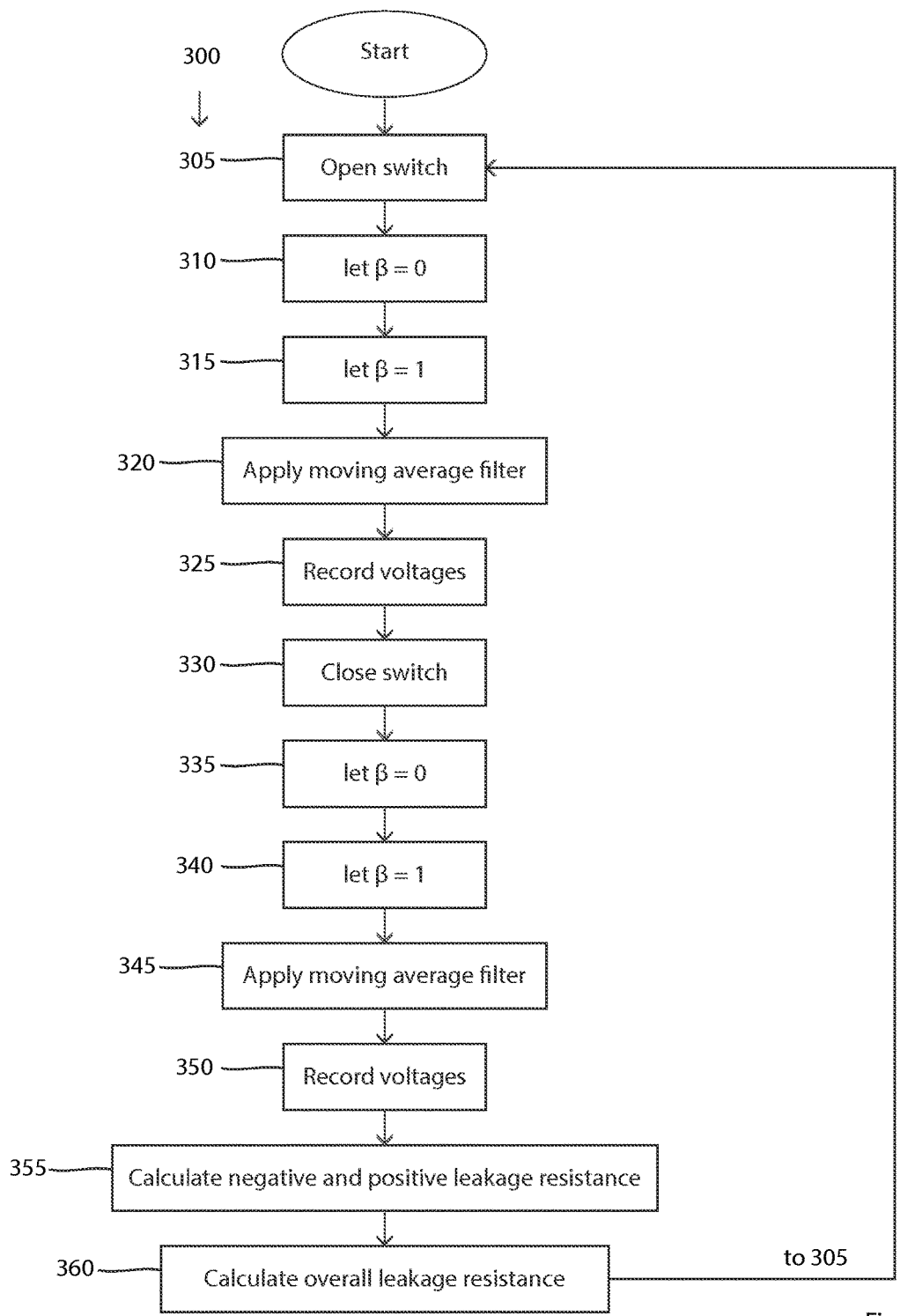
FIG. 3 illustrates an exemplary process for determining the leakage of the circuit.

FIG. 3 is an exemplary process 300 for determining the leakage of the circuit 135. The process 300 may be completed, in part, by the controller 130. It may also be completed by another computing device external to the battery pack 114, such as another vehicle controller. Throughout the process 300, various low pass filters may be applied to the voltage measurements at the positive side ($V_{LP}$ and $V_P$) in the FIG. 2A or at the negative side ($V_{LN}$ and $V_P$) in the FIG. 2B. Without the loss of generality, we use the measurement at the positive side to explain the process 300. The moving average filters may apply the below equations to achieve steady state values:

$$V_{LP}^f(k) = [\alpha x(k)V_{LP}(k) + (1-\alpha)V_{LP}^f(k-1)] \times \beta \quad \text{(Eq.16)}$$

$$V_P^f(k) = [\alpha x(k)V_P(k) + (1-\alpha)V_P^f(k-1)] \times \beta \quad \text{(Eq.17)}$$

where k is time, having a sampling rate of approximately 10 ms-100 ms. For example, for every second, 10 samples may be applied. β may switch the filter on and off. If β=0, the filter is turned off and always delivers zeros. On the other hand, if β=1, the filter is turned on and delivers non-zero values.

The process may begin at block 305. At block 305, the switch SW may open, as shown in FIG. 2.

At block 310, β may be set to β=0 for a predetermined time period, for example, 0.5 seconds. The amount of time may vary, but may be enough to allow the circuit to stabilize following the opening of the switch.

At block 315, β may be set to β=1 for another predetermined time period, for example, 1 second. At block 320, the moving average filter may be applied to the positive leakage voltage measurement $V_{LP}$ and the battery pack voltage measurement $V_P$ using equations 16 and 17 above.

At block 325, the filtered positive leakage voltage value $V_{LP}^f(k)$ and the filtered battery pack voltage $V_P^f(k)$ may be recorded such that:

$$V_{LP2} = V_{LP}^f(k) \quad \text{(Eq.18)}$$

$$V_{P2} = V_P^f(k) \quad \text{(Eq.19)}$$

At block 330, the switch SW may close. The process 300 continues as the Blocks 335-350 closely mimic blocks 310-325 described above. In blocks 335-350, additional voltage measurements are taken with the switch SW being closed.

At block 355, the positive and negative leakage resistances are calculated using equations 7 and 8 above. The resistances are calculated based on the filtered voltage values at the positive side (e.g., $V_{LP}$, $V_P$).

At block 360, the overall leakage resistance may be calculated using equation 9 above. This resistance indicates the overall leakage of the circuit, at both the positive and negative sides. Unlike traditional circuits, the above circuit 135 and process 300 detects leakage using a single switch and a single voltage measurement circuit. A small leakage resistance may indicate an isolation issue between the battery pack 114 and the chassis.

The process may return to block 305 and continue to predict the leakage resistance of the circuit 135.

Figure 4:
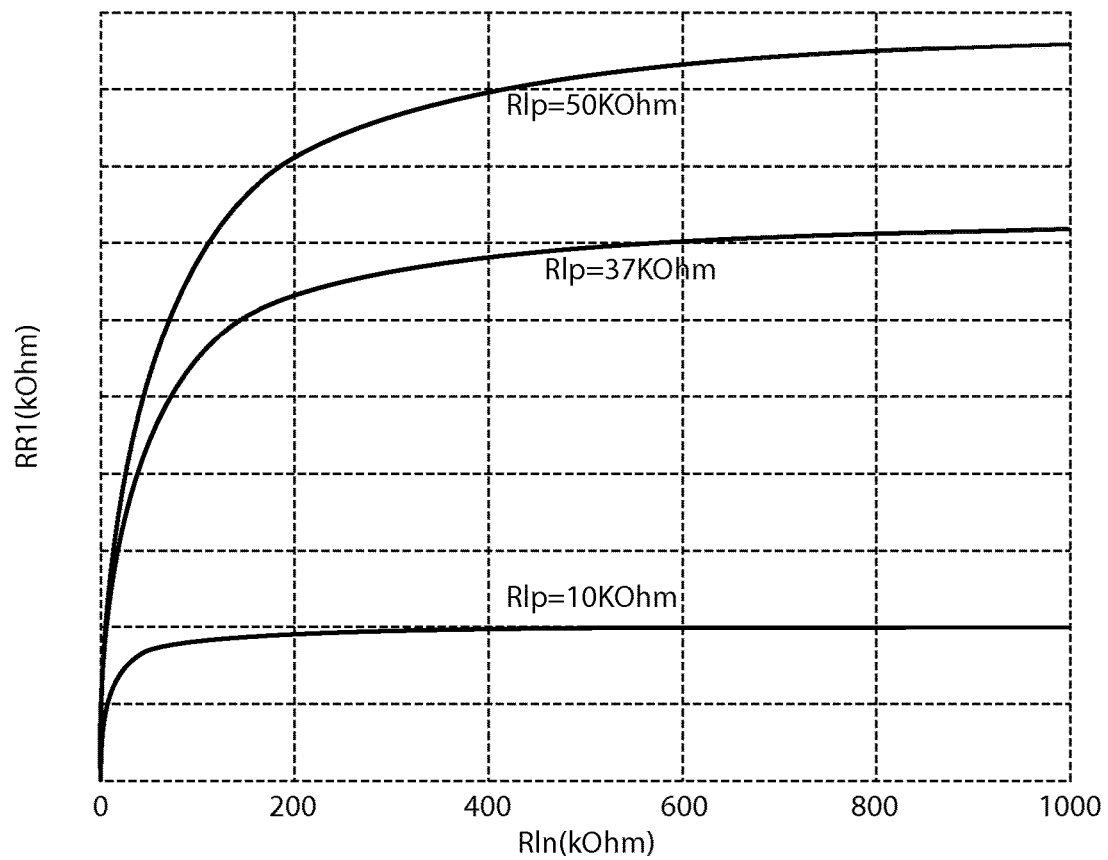
FIG. 4 is an exemplary chart showing the leakage resistances.

FIG. 4 is an exemplary chart showing the overall leakage resistance across the leakage resistance at the negative side. The overall leakage (RR) is estimated by using the proposed system on simulative leakage data. When the battery pack 114 leaks on positive side with resistances of 37 KOhm, the overall leakage resistance estimated by proposed circuit and algorithm is around 37 KOhm. When battery pack 114 leaks on both sides with resistances less than 10 KOhm, the overall leakage resistance estimated by proposed circuit and system is around 5 KOhm. The isolation issue was still detected.

Accordingly, the above system uses a single switch (e.g., switch SW) and a single voltage measurement circuit. The circuit described herein is capable of predicting overall leakage on any condition including the leakage on either positive or negative side, and even in situations where the leakage on each side of the battery pack is similar. While the diagrams described above may be referred to as having a positive and negative side, these orientations may be reversed.

Computing devices, such as but not limited to the controller 130, generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, the use of the words "first," "second," etc., may be interchangeable.

What is claimed is:

1. A leakage detection system for a battery pack of a vehicle comprising:
   detection circuitry having a first side connecting a positive terminal of the pack to ground and a second side connecting a negative terminal of the pack to ground, and including no more than one switch among the sides;
   measurement circuitry configured to measure a voltage at a resistor of one of the sides when the switch is open and closed; and
   a controller programmed to control the switch to open and close according to at least one trigger event, and to output a leakage associated with the battery pack based on the voltage at the resistor when the switch is open and closed according to the trigger event,
   wherein the switch and measurement circuitry are disposed on opposite ones of the sides of the detection circuitry.

2. The system of claim 1, wherein the controller is further programmed to output the leakage based on a leakage resistance at each of the first and second sides of the detection circuitry.

3. The system of claim 1, wherein the controller is further programmed to apply a filter to the voltage prior to outputting the leakage.

4. The system of claim 3, wherein the filter is a moving average filter.

5. The system of claim 1, wherein the trigger event includes an expiration of a predefined amount of time.

6. A battery leakage detection system comprising:
   detection circuitry having first and second battery sides, and including one switch and a measurement circuitry disposed on a side opposite the switch;
   and a controller programmed to control the switch to open and close according to a trigger event, and to output a leakage associated with the battery based on a voltage at a resistor of the measurement circuitry when the switch is opened and closed.

7. The system of claim 6, wherein the trigger event includes an expiration of a predefined amount of time.

8. The system of claim 6, wherein the controller is further programmed to output the leakage based on a leakage resistance at each of the first and second sides of the detection circuitry.

9. The system of claim 6, wherein the controller is further programmed to apply a filter to the voltage prior to outputting the leakage.

10. The system of claim 9, wherein the filter is a moving average filter.

* * * * *